US005786230A

United States Patent [19]
Anderson et al.

[11] Patent Number: 5,786,230
[45] Date of Patent: Jul. 28, 1998

[54] METHOD OF FABRICATING MULTI-CHIP PACKAGES

[75] Inventors: Samuel J. Anderson, Tempe; Guillermo L. Romero, Scottsdale, both of Ariz.

[73] Assignee: Motorola, Inc., Schaumburg, Ill.

[21] Appl. No.: 431,865

[22] Filed: May 1, 1995

[51] Int. Cl.$^6$ ..................................................... H01L 21/60
[52] U.S. Cl. ........................... 437/209; 437/902; 437/205; 257/778
[58] Field of Search .................. 437/205, 209, 437/902; 257/778

[56] References Cited

U.S. PATENT DOCUMENTS

| | | | |
|---|---|---|---|
| 3,936,866 | 2/1976 | Grossman et al. | 357/80 |
| 4,502,932 | 3/1985 | Kline et al. | 310/320 |
| 4,561,011 | 12/1985 | Kohara et al. | 257/778 |
| 5,198,385 | 3/1993 | Devitt et al. | 437/205 |
| 5,258,648 | 11/1993 | Lin | 257/778 |
| 5,297,001 | 3/1994 | Sterling | 361/717 |
| 5,348,617 | 9/1994 | Braymen | 156/644 |
| 5,381,304 | 1/1995 | Theroux et al. | 361/706 |
| 5,386,339 | 1/1995 | Polinski, Sr. | 361/719 |
| 5,532,513 | 7/1996 | Smith et al. | 257/703 |
| 5,534,462 | 7/1996 | Fiordalice et al. | 437/190 |

OTHER PUBLICATIONS

Chung-Daw Young et al., "Indirect Bonding of Ni–Electroless Plated AlN and Cu by Hot Pressing Method", IEEE Transactions On Components, Packaging, And Manufacturing Technology–Part A., vol. 17 No. 4, Dec. 1994, pp. 644–653.

"Flip–Chip attachment Heatsink with Decoupling Capacitor", IBM Technical Bulletin, vol. No. 37, 06A, p. 187, Jun. 1, 1994.

Primary Examiner—John Niebling
Assistant Examiner—Kevin F. Turner
Attorney, Agent, or Firm—Eugene A. Parsons

[57] ABSTRACT

A method of fabricating a multi-chip package including an aluminum silicon substrate with an aluminum nitride layer thereon forming an electrically insulated surface and aluminum heat conductive areas positioned on the insulated surface. Conductors on the surface of the substrate defining mounting areas and external connections with each mounting area positioned adjacent an associated one of the heat conductive areas and a semiconductor chip mounted in each mounting area. Heat conductive elements connected to the rear surface of each chip and to the associated one of the plurality of heat conductive areas, and each chip encapsulated with reworkable encapsulant.

21 Claims, 4 Drawing Sheets

METHOD OF FABRICATING MULTI-CHIP PACKAGES

FIELD OF THE INVENTION

The present invention pertains to integrated circuit packaging and more specifically to integration of semiconductor chips at the wafer level.

BACKGROUND OF THE INVENTION

Integration of multiple semiconductor chips, and especially power multi-chip modules, is becoming increasingly important in industrial systems. Generally, semiconductor chips are assembled into modules utilizing printed circuit boards, ceramic substrates (hybrids), etc. To produce such assemblies, the semiconductor chips are fabricated in a standard semiconductor fabrication plant, packaged and shipped to a separate assembly area or plant. Printed circuit boards or ceramic substrates are provided and, along with various other parts, the components are assembled and packaged.

In addition to requiring large amounts of assembly labor, this assembly process requires additional equipment, space and storage for stocking the components. Also, the modules generally require some type of heat sink, especially if it is a power multi-chip module, which increases the size and weight of the final package. Further, the printed circuit boards or ceramic substrates add weight and bulk to the modules without providing any function except support of the components.

Accordingly, it would be highly advantageous to devise a method of packaging multi-chips modules more efficiently and in smaller packages.

It is a purpose of the present invention to provide a new and improved process of fabricating multi-chip packages.

It is another purpose of the present invention to provide a new and improved process of fabricating multi-chip packages, which process can be performed entirely at the semiconductor wafer processing level.

It is a further purpose of the present invention to provide new and improved multi-chip packages.

It is a further purpose of the present invention to provide new and improved multi-chip packages which are simpler and cheaper to fabricate and which are smaller and more compact.

It is a still further purpose of the present invention to provide new and improved multi-chip packages in which the cost of isolation and thermal management is substantially reduced.

SUMMARY OF THE INVENTION

The above problems and others are at least partially solved and the above purposes and others are realized in a method of fabricating a multi-chip package including the step of providing a semiconductor substrate with an electrically insulated surface and a plurality of heat conductive areas formed thereon, and providing a plurality of semiconductor chips, each chip having an electrical circuit formed thereon and a plurality of electrical I/O pads connected to the electrical circuit and positioned on one surface of the semiconductor chip, and each chip further having a second surface provided for attaching a heat sink thereto. A plurality of electrical conductors are formed on the surface of the substrate so as to define a plurality of semiconductor chip mounting areas with each mounting area having a plurality of bonding pads coupled to the electrical conductors and positioned to mate with the I/O pads of at least one mating semiconductor chip of the plurality of semiconductor chips, and each mounting area is further positioned adjacent an associated one of the plurality of heat conductive areas. One each of the plurality of semiconductor chips is mounted in each of the plurality of mounting areas with the bonding pads in each mounting area electrically connected to the I/O pads of the mating semiconductor chip for each mounting area. One each of a plurality of heat conductive elements is connected to the second surface of each semiconductor chip and to the associated one of the plurality of heat conductive areas so as to provide heat sinking.

The heat conductive elements may also serve to connect an electrical terminal on the second side of the semiconductor chip to an electrical conductor. The semiconductor chips are then encapsulated, preferably with a reworkable thermosetting epoxy.

BRIEF DESCRIPTION OF THE DRAWINGS

Referring to the drawings.

DESCRIPTION OF THE PREFERRED EMBODIMENTS

Figure 1:
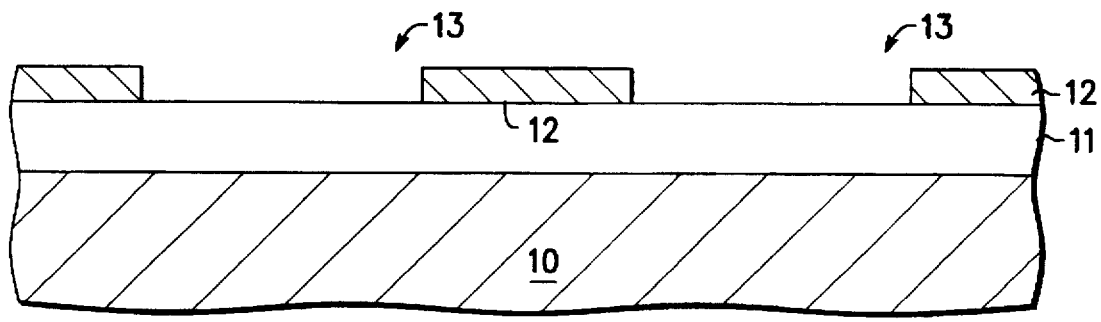
FIGS. 1 through 3 are cross-sectional views, portions thereof removed, illustrating various sequential steps in the fabrication of a multi-chip package in accordance with the present invention.
Figure 2:
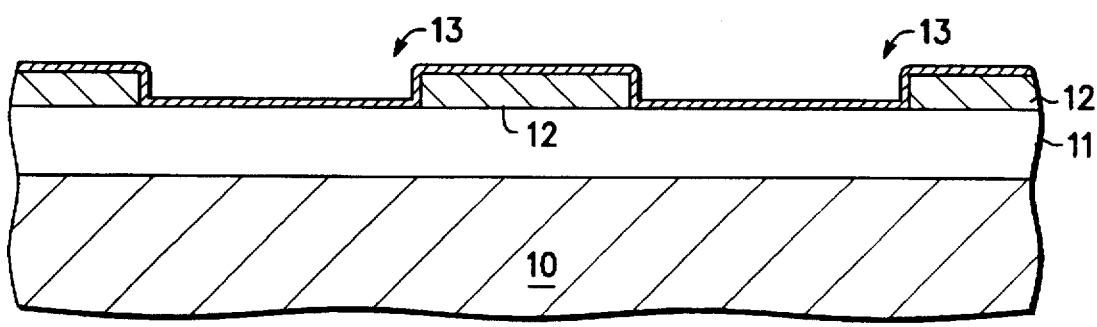
Figure 3:
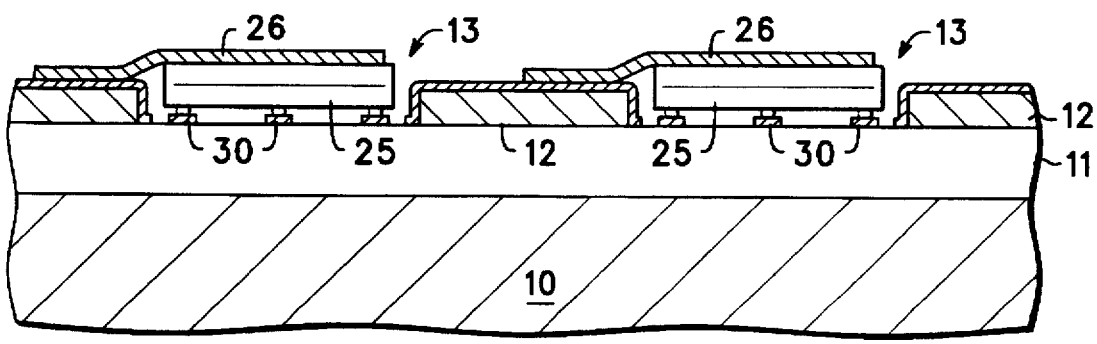

Referring to FIGS. 1-3, several sequential steps in a process of fabricating multi-chip packages in accordance with the present invention are illustrated. Specifically, FIG. 1 illustrates a substrate 10 formed of a semiconductor material which is preferably heat conductive. In this specific embodiment substrate 10 is formed of aluminum silicon carbide (AlSiC) but it will be understood that other semiconductor materials may be utilized in suitable applications. As is known in the art, AlSiC is generally formed by casting a wafer or the like of silicon carbide and including some material that can be relatively easily burned or otherwise removed to leave a porous substrate. The substrate is then impregnated with liquid aluminum to provide the final AlSiC. Generally, AlSiC is a very good heat conductor but it also conducts electricity to some extent.

A thin layer of insulating material, which in this specific embodiment is aluminum nitride (hereinafter referred to as AlN layer 11), is then positioned on the upper surface of substrate 10 to form an electrically insulating surface. A thin layer of heat conductive material, which may be an aluminum layer, an AlSiC layer, etc. and in a preferred embodiment is aluminum (hereinafter referred to as Al layer 12), is then positioned on the upper surface of AlN layer 11. Because AlSiC and AlN are relatively difficult to work with, in the sense of semiconductor processing (e.g. etching and the like), substrate 10, AlN layer 11 and Al layer 12 are cast in the desired shape (e.g. wafer, etc.). It should be noted that Al layer 12 is relatively simple to provide since it can be cast in a desired shape during the impregnation or infiltration step of forming substrate 10. AlN layer 11 is preformed and the entire structure is fixed as illustrated by standard wafer bonding techniques. As will be explained in more detail presently, in this embodiment Al layer 12 has a plurality of openings 13 formed therethrough to expose portions of the surface of AlN layer 11.

A thin insulating layer 14 (best seen in FIG. 5) is formed at least on portions of Al layer 12. Insulating layer 14 can be any layer of dielectric material normally used in semiconductor fabrication areas, such as silicon nitride or other nitrides. A layer of electrically conducting metal, such as aluminum, (hereinafter metal layer 15) is then deposited by some convenient operation, such as sputtering or the like. Metal layer 15 is deposited at least on the portions of insulating layer 14 covering Al layer 12 and in openings 13.

Metal layer 15 can be patterned and etched after deposition, or a pattern of photoresist can be deposited first and patterned, after which metal layer 15 is deposited thereover. In either case, electrical conductors 18 are formed from metal layer 15 which extend into openings 13 and define a chip mounting area therein. Each chip mounting area includes a plurality of bonding pads 20 coupled to electrical conductors 18 and positioned to mate with the I/O pads of at least one mating semiconductor chip. Generally, insulating layer 14 is utilized on Al layer 12 to prevent shorting of electrical conductors 18 by the aluminum material.

With electrical conductors 18 and bonding pads 20 properly formed and positioned, a mating semiconductor chip 25 (in this embodiment a flip-chip) is mounted on bonding pads 20 in each mounting area in each opening 13. A plurality of semiconductor chips 25 are provided. Each semiconductor chip 25 has an electrical circuit formed thereon in the usual fashion and a plurality of electrical I/O pads connected to the electrical circuit and positioned on a lower surface of semiconductor chip 25 so as to mate with bonding pads 20 in at least one opening 13. Each semiconductor chip 25 further has an upper surface designed to attach a heat sink thereto. Semiconductor chips 25 are mounted by any of the well known methods, such as solder bumps, solder preforms, etc.

Once semiconductor chips 25 are properly mounted on and connected to electrical conductors 15 in an opening 13, heat conductive elements 26 are connected from each associated heat sink area on Al layer 12, adjacent each opening 13, to the upper surface of each semiconductor chip 25. In this embodiment, heat conductive elements 26 are metal straps, formed of copper, aluminum, or the like which is a good heat and a good electrical conductor. Heat conductive elements 26 are connected to semiconductor chips 25 and to a portion of metal layer 15 on the surface of Al layer 12 by any convenient means, such as soldering, welding, or the like. While insulating layer 14 is sandwiched between Al layer 12 and metal layer 15, it is thin enough so that heat is readily passed from each semiconductor chip 25 and conductive element 26 to Al layer 12 and then to substrate 10.

Figure 4:
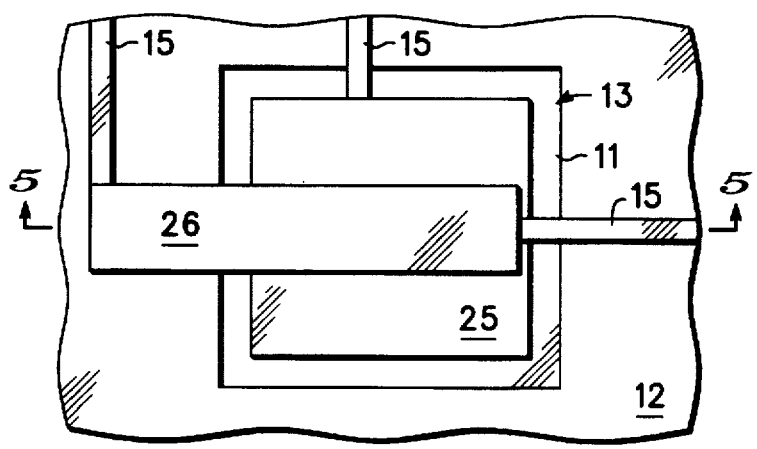
FIG. 4 is an enlarged view in top plan of a portion of FIG. 3.
Figure 5:
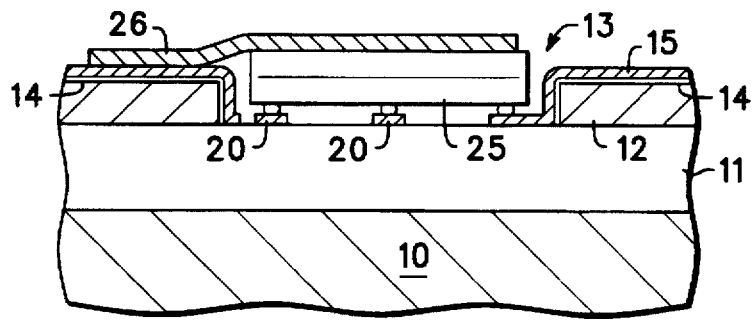
FIG. 5 is a sectional view of the structure of FIG. 4, as seen from the line 4—4, illustrating additional detail.

Referring specifically to FIGS. 4 and 5, enlarged views of a single semiconductor device in top plan and cross-section are illustrated. In these views the details of the various layers of material and the electrical connections to semiconductor chip 25 are more clearly illustrated. Further, the shape of openings 13 and the manner of making electrical connections to various different types of semiconductor chips can be readily appreciated.

Figure 6:
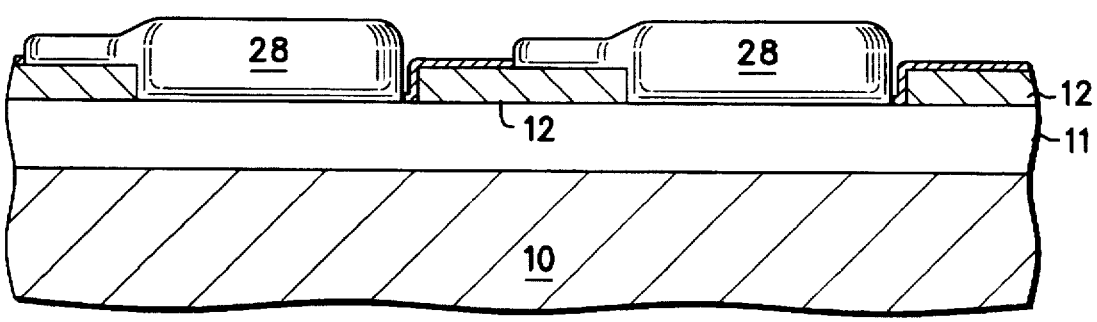
FIG. 6 is cross-sectional view, similar to FIG. 3, illustrating a final sequential step in the fabrication of the multi-chip package.

With semiconductor chips 25 fixedly mounted in openings 13 and conductive elements 26 providing a heat sinking action and an electrical connection to the upper surface of semiconductor chip 25 (in this specific example), the structure can be appropriately encapsulated. In this example, each semiconductor chip 25 and conductive element 26 is separately encapsulated with a reworkable thermosetting epoxy 28, as illustrated in FIG. 6. Since these types of packages are generally expensive, utilizing an encapsulant that can be removed and applying it so that individual components can be uncovered and repaired, removed and replaced, etc. provides a substantial advantage. It will of course be understood that other encapsulation techniques, e.g. complete and permanent encapsulation, can be utilized if desired or appropriate.

Figure 7:
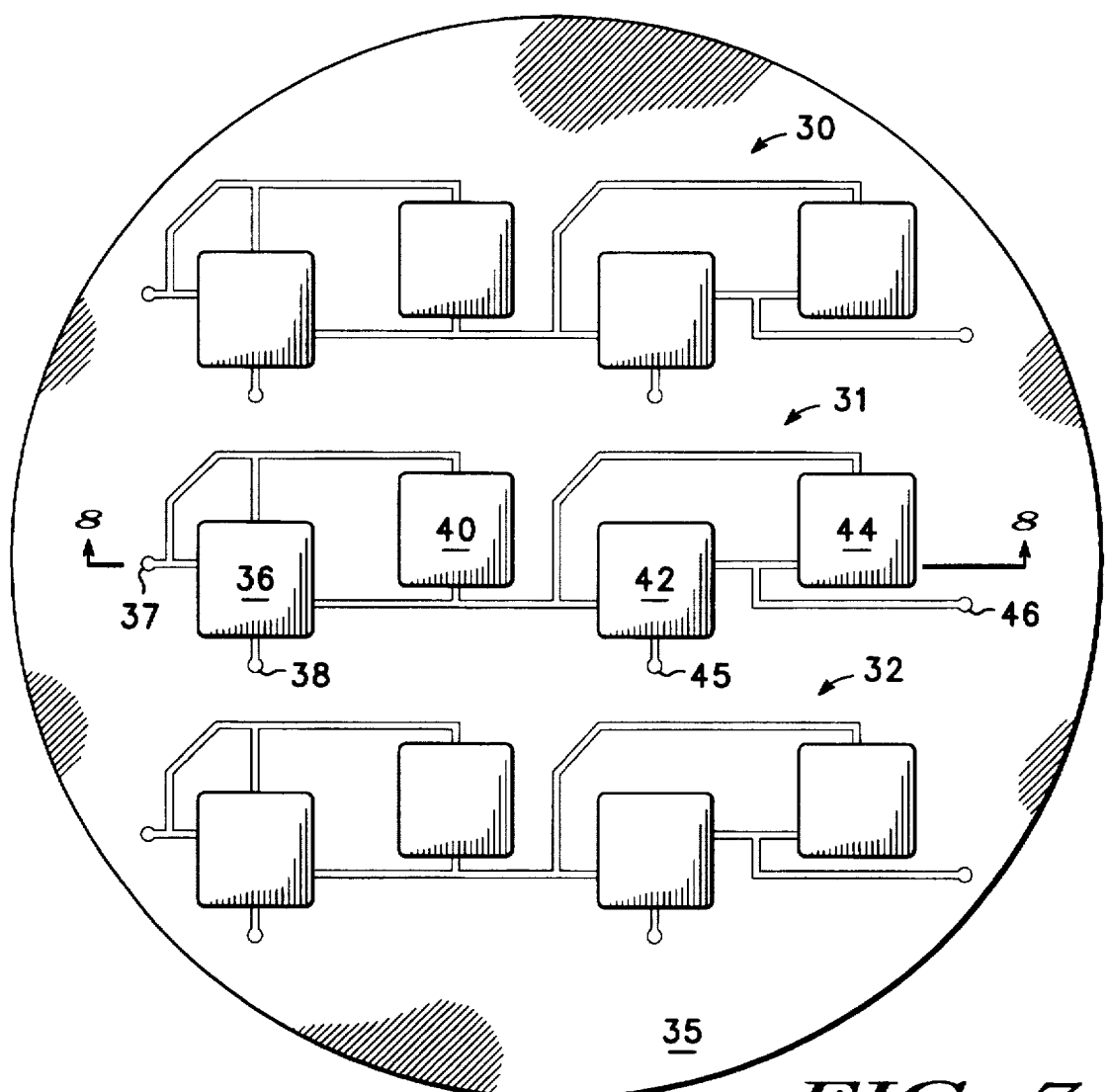
FIG. 7 is a view in top plan of a specific multi-chip package in accordance with the present invention.
Figure 8:
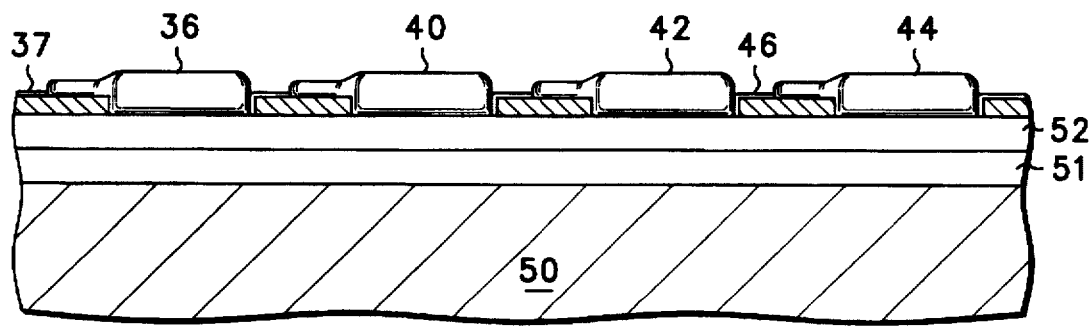
FIG. 8 is a sectional view, portions thereof removed, as seen from the line 8—8 of FIG. 7.

Referring specifically to FIGS. 7 and 8, an example of specific multi-chip circuitry packaged in accordance with the present invention is illustrated. In this specific example, a power module for a three phase motor control circuit is illustrated to explain the present invention. Three motor control circuits 30, 31 and 32 are illustrated, generally in block diagram, in FIG. 7 to better illustrate the approximate position of each of the components on a six inch wafer 35. Each control circuit 30, 31 and 32 is similar and, therefore, only circuit 31 will be explained in detail, with the aid of FIG. 7, which is a sectional view through control circuit 31.

Control circuit 31 includes a first insulated gate bipolar transistor 36 (IGBT) with an external terminal 37 connected to the collector and an external terminal 38 connected to the gate. A free-wheeling diode 40 (FWD) is connected in circuit with IGBT 36 in a well known manner to provide sharp, positive switching. The output of IGBT 36 (the emitter) is connected to the collector of a second IGBT 42, which also has a FWD 44 connected in circuit therewith. An external terminal 45 is connected to the gate of IGBT 42 and an external terminal 46 is connected to the emitter of IGBT 42. As will be understood by those skilled in the art, terminals 37 and 46 are the power terminals of the circuit and terminals 36 and 45 are the control terminals.

Referring now to FIG. 8, an AlSiC substrate 50 is provided with an insulating layer 51 positioned on the upper surface thereof to form an insulated upper surface and an Al layer 52 positioned on insulating layer 51 to provide pockets in which semiconductor chips are mounted. As previously described, a thin layer of insulating material is deposited over the surface and edges of Al layer 52 so that electrical conductors can be deposited in the pockets and on the upper surface of the structure. In this example, each IGBT 36 and 42 is fabricated on a semiconductor chip as a separate circuit and as flip-chips with the upper surface being the collector and each FWD 40 and 44 is fabricated on a semiconductor chip as a separate circuit and as flip chips with one terminal on each side of the semiconductor chip.

Thus, with IGBT 36 mounted in the first (left hand) pocket, a connection to the collector is formed at the surface of the heat conductive area (the surface of Al layer 52 to the left of the first pocket) by the heat conductive element extending between the upper surface of the semiconductor chip and the adjacent surface of Al layer 52. This connection is designated terminal 37. Similarly, terminal 42 can be positioned either at the surface of Al layer 52 to the left of IGBT 42 or to the left of FWD 44, the latter of which is designated terminal 42 as an example. External terminals 38 and 45 are not illustrated in FIG. 8 since they are connected to the lower surface of the semiconductor chips in the pocket by the electrical conductors and can be positioned at any convenient position on the surface of Al layer 52. As illustrated in FIG. 8, the semiconductor chips are encapsulated and the entire wafer 35 is formed as a package with only various electrical contacts being accessible.

Figure 9:
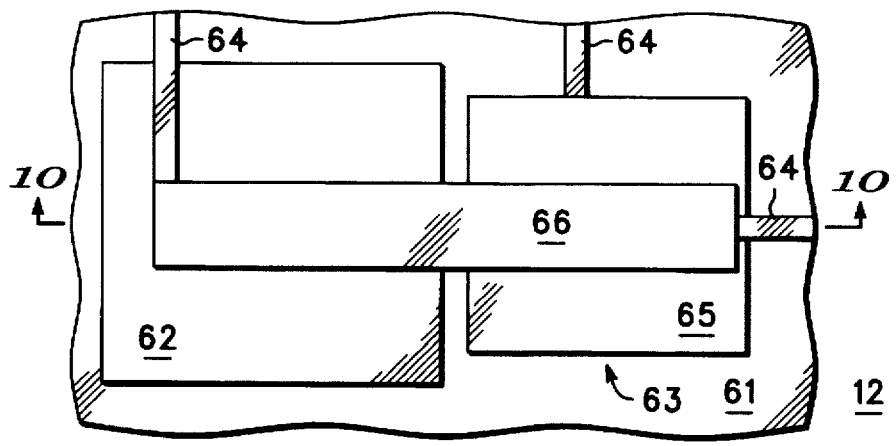
FIG. 9 is a view in top plan, portions thereof removed, of another embodiment of a multi-chip package in accordance with the present invention.
Figure 10:
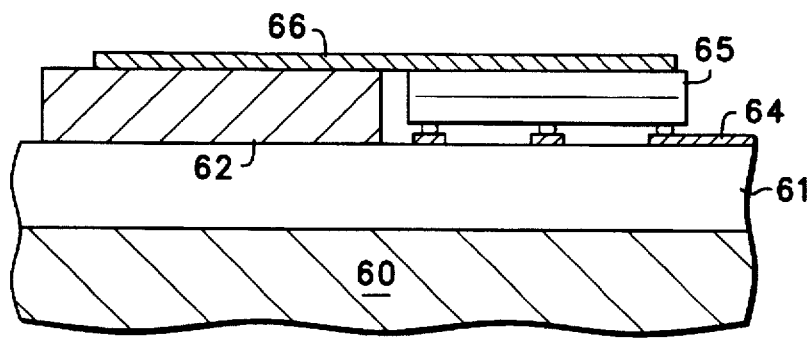
FIG. 10 is a sectional view, portions thereof removed, as seen from the line 10—10 of FIG. 9.

Referring now to FIGS. 9 and 10, top plan and cross-sectional views of another embodiment of the present invention are illustrated. In this embodiment, an AlSiC substrate 60 is provided with an AlN layer 61 positioned on the surface thereof to form an electrically insulated surface, as previously explained. However, in this embodiment an Al layer 62 is formed and positioned on the surface of insulating layer 61 so that individual portions thereof are present only adjacent chip mounting area 63 to form a heat conductive area associated with each chip mounting area 63. It should be noted that in this embodiment the additional insulating layer (layer 14 in FIG. 5) is not needed since electrical conductors 64 are simply positioned on the electrically insulated surface of layer 61 and the entire portion of Al layer 62 forming the heat conductive area can serve as the external contact, through heat conductive element 66, to the upper surface of a semiconductor chip 65 mounted in mounting area 63.

Figure 11:
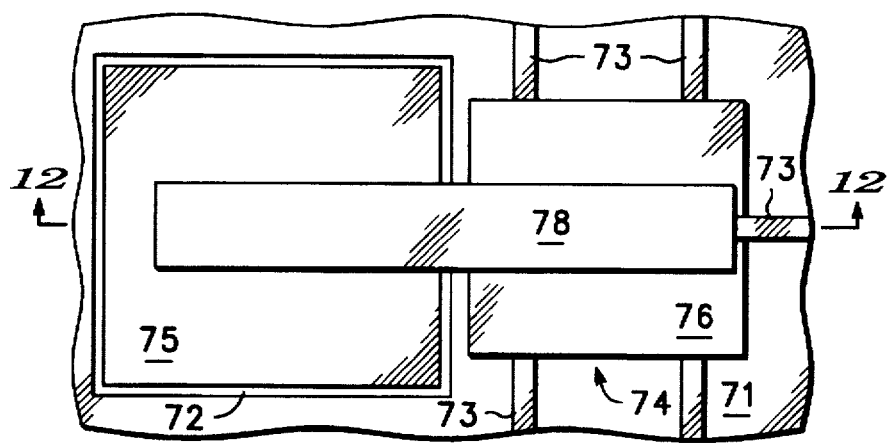
FIG. 11 is a view in top plan, portions thereof removed, of another embodiment of a multi-chip package in accordance with the present invention.
Figure 12:
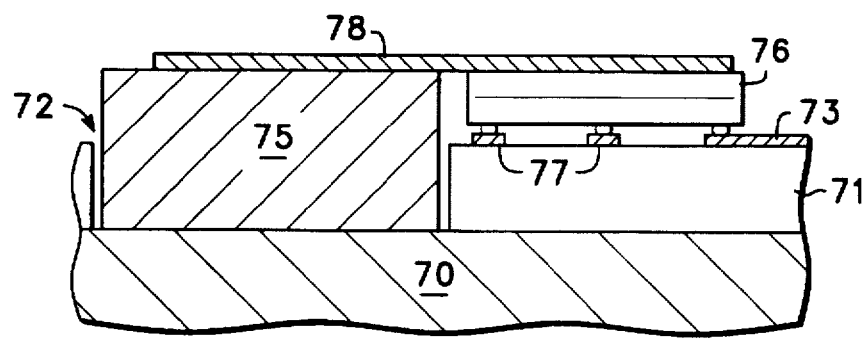
FIG. 12 is a sectional view, portions thereof removed, as seen from the line 12—12 of FIG. 11.

Referring now to FIGS. 11 and 12, top plan and cross-sectional views of another embodiment of the present invention are illustrated. In this embodiment, an AlSiC substrate 70 is provided with an AlN layer 71 positioned on the surface thereof to form an electrically insulated surface, as previously explained. However, in this embodiment pockets 72 are formed in AlN layer 71 to define the heat conductive areas. Electrical conductors 73 are positioned on the electrically insulating surface of AlN layer 71 to define a plurality of semiconductor chip mounting areas 74, with each chip mounting area 74 being positioned adjacent a pocket 72. A portion of an Al layer 75 is positioned in each pocket 73 and bonded to AlSiC substrate 70 for good heat conduction. A semiconductor chip 76, having I/O pads 77 on the lower surface thereof that mate with bonding pads formed by electrical conductors 73, is mounted in each semiconductor chip mounting area 74. The upper surface of semiconductor chip 76 is connected to Al layer 75 by a heat conducting element 78. If the upper surface of semiconductor chip 76 does not require an electrical connection, heat conducting element 78 conducts heat from semiconductor chip 76 directly to substrate 70 without the necessity of intervening insulating layers.

Figure 13:
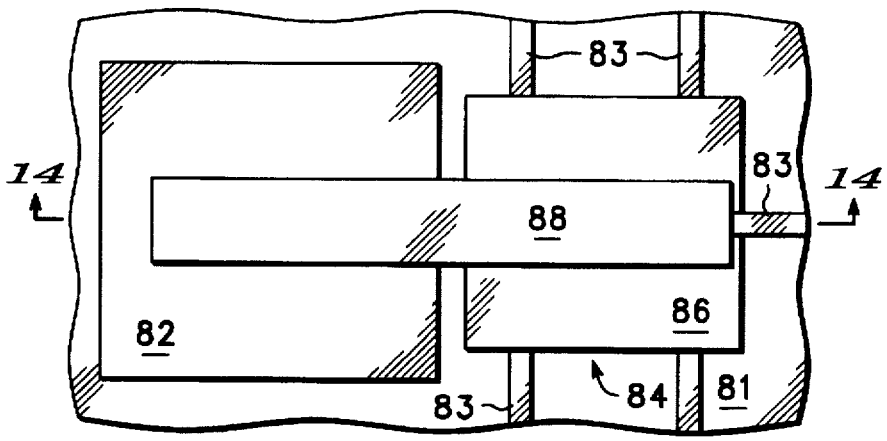
FIG. 13 is a view in top plan, portions thereof removed, of another embodiment of a multi-chip package in accordance with the present invention.
Figure 14:
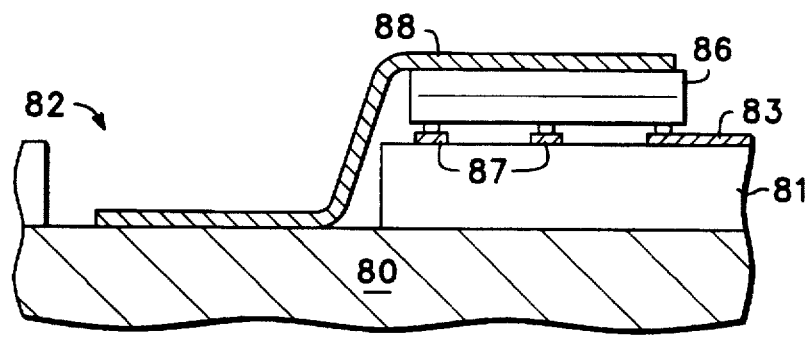
FIG. 14 is a sectional view, portions thereof removed, as seen from the line 14—14 of FIG. 13.

Referring now to FIGS. 13 and 14, top plan and cross-sectional views of another embodiment of the present invention are illustrated. In this embodiment, an AlSiC substrate 80 is provided with an AlN layer 81 positioned on the surface thereof to form an electrically insulated surface, as previously explained. In this embodiment pockets 82 are formed in AlN layer 81 to define the heat conductive areas. Electrical conductors 83 are positioned on the electrically insulating surface of AlN layer 81 to define a plurality of semiconductor chip mounting areas 84, with each chip mounting area 84 being positioned adjacent a pocket 82. A semiconductor chip 86, having I/O pads 87 on the lower surface thereof that mate with bonding pads formed by electrical conductors 83, is mounted in each semiconductor chip mounting area 84. The upper surface of semiconductor chip 86 is connected to AlSiC substrate 80 by a heat conducting element 88. If the upper surface of semiconductor chip 86 does not require an electrical connection, heat conducting element 88 conducts heat from semiconductor chip 86 directly to substrate 80 without the necessity of intervening insulating layers.

It should be specifically noted that the entire fabrication processes disclosed can be completely performed in a semiconductor wafer facility with no need to protect, ship, store, etc., various intermediate components. Also, the additional labor and equipment required in outside facilities is not required. Accordingly, new and improved processes of fabricating multi-chip packages have been disclosed. The new and improved processes of fabricating multi-chip packages can be performed entirely at the semiconductor wafer processing level so that labor, shipping, handling and storage costs are substantially reduced. Also, new and improved multi-chip packages are disclosed which are simpler and cheaper to fabricate and which are smaller and more compact. Further, the new and improved processes result in multi-chip packages in which the cost of isolation and thermal management is substantially reduced.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a multi-chip package comprising the steps of:

providing a semiconductor substrate with an electrically insulated surface and providing on the substrate a plurality of heat conductive areas;

providing a plurality of semiconductor chips, each chip having an electrical circuit formed thereon and a plurality of electrical I/O pads connected to the electrical circuit and positioned on one surface of the semiconductor chip, each chip further having a second surface provided for attaching a heat sink thereto;

forming a plurality of electrical conductors on the surface of the substrate so as to define a plurality of semiconductor chip mounting areas with each mounting area having a plurality of bonding pads coupled to the electrical conductors and positioned to mate with the I/O pads of at least one mating semiconductor chip of the plurality of semiconductor chips, each mounting area being further positioned adjacent an associated one of the plurality of heat conductive areas;

mounting one each of the plurality of semiconductor chips in each of the plurality of mounting areas with the one surface of the semiconductor chip adjacent the electrically insulated surface of the substrate and the bonding pads in each mounting area electrically connected to the I/O pads of the mating semiconductor chip for each mounting area; and connecting one each of a plurality of heat conductive elements to the second surface of each semiconductor chip and to the associated one of the plurality of heat conductive areas.

2. A method of fabricating a multi-chip package as claimed in claim 1 wherein the step of providing the semiconductor substrate with the electrically insulated surface includes providing an aluminum silicon carbide substrate.

3. A method of fabricating a multi-chip package as claimed in claim 2 wherein the step of providing the aluminum silicon carbide substrate further includes providing a layer of aluminum nitride on the substrate to form the electrically insulated surface.

4. A method of fabricating a multi-chip package as claimed in claim 3 wherein the step of providing on the substrate the plurality of heat conductive areas includes providing a layer of aluminum positioned on the layer of aluminum nitride and defining openings through the layer of aluminum at the mounting areas so as to expose the layer of aluminum nitride in the openings.

5. A method of fabricating a multi-chip package as claimed in claim 4 wherein the step of forming the plurality of electrical conductors on the surface of the substrate includes depositing an insulating layer on at least portions of the layer of aluminum and depositing a layer of metal on the insulating layer and in the plurality of openings so as to define the plurality of electrical conductors.

6. A method of fabricating a multi-chip package as claimed in claim 3 wherein the step of providing on the substrate the plurality of heat conductive areas includes defining openings through the layer of aluminum nitride to expose the substrate at the heat conductive areas.

7. A method of fabricating a multi-chip package as claimed in claim 6 wherein the step of forming the plurality of electrical conductors on the surface of the substrate includes depositing a layer of metal on the electrically insulated surface and on the plurality of semiconductor chip mounting areas and removing portions of the layer of metal to define the plurality of electrical conductors.

8. A method of fabricating a multi-chip package as claimed in claim 5 wherein the step of depositing the layer of metal includes depositing the metal by sputtering.

9. A method of fabricating a multi-chip package as claimed in claim 8 wherein the step of depositing the layer of metal includes depositing a layer of aluminum.

10. A method of fabricating a multi-chip package as claimed in claim 5 including the step of removing portions of the layer of metal to define the plurality of electrical conductors by the steps of patterning and etching the layer of metal.

11. A method of fabricating a multi-chip package as claimed in claim 5 wherein the step of connecting one each of the plurality of heat conductive elements to the second surface of each semiconductor chip and to the associated one of the plurality of heat conductive areas includes providing a plurality of metal straps for the heat conductive elements, one each for each semiconductor chip, and connecting one end of each metal strap to the second surface of the semiconductor chip and connecting a second end of the metal strap to the associated one of the heat conductive areas on the layer of aluminum.

12. A method of fabricating a multi-chip package as claimed in claim 11 wherein the step of providing the plurality of semiconductor chips, each chip having an electrical circuit formed thereon includes providing a plurality of semiconductor chips having a transistor formed thereon with first and second terminals on the first surface and a third terminal on the second surface, and the first and second surfaces are opposed major surfaces of the semiconductor chip and the metal straps electrically connect the third terminal of the transistor to one of the plurality of electrical conductors.

13. A method of fabricating a multi-chip package as claimed in claim 6 wherein the step of connecting one each of the plurality of heat conductive elements to the second surface of each semiconductor chip and to the associated one of the plurality of heat conductive areas includes providing a plurality of metal straps for the heat conductive elements, one each for each semiconductor chip, and connecting one end of each metal strap to the second surface of the semiconductor chip and connecting a second end of the metal strap to the associated one of the openings through the layer of aluminum nitride.

14. A method of fabricating a multi-chip package as claimed in claim 1 wherein each semiconductor chip of the plurality of semiconductor chips is encapsulated after the connecting step.

15. A method of fabricating a multi-chip package as claimed in claim 14 wherein the step of encapsulating each semiconductor chip includes encapsulating with a reworkable thermosetting epoxy.

16. A method of fabricating a multi-chip package comprising the steps of:

providing a semiconductor substrate of aluminum silicon carbide with a layer of aluminum nitride positioned thereon and forming an electrically insulated surface, providing on the electrically insulated surface a layer of aluminum defining a plurality of heat conductive areas, and openings defined in the layer of aluminum so as to expose portions of the electrically insulated surface;

providing a plurality of semiconductor chips, each chip having a transistor formed thereon, the transistor having first and second electrodes connected to a plurality of electrical I/O pads positioned on one major surface of the semiconductor chip and a third electrode with an I/O pad positioned on a second major surface, in opposed relationship to the first major surface;

forming an insulative layer on at least portions of the layer of aluminum;

forming a plurality of electrical conductors on the insulative layer and on the exposed portions of the electrically insulated surface so as to define a plurality of semiconductor chip mounting areas with each mounting area having a plurality of bonding pads coupled to the electrical conductors and positioned to mate with the I/O pads of at least one mating semiconductor chip of the plurality of semiconductor chips, each mounting area being further positioned adjacent an associated one of the plurality of heat conductive areas;

mounting one each of the plurality of semiconductor chips in each of the plurality of mounting areas with the one major surface of the semiconductor chip adjacent the electrically insulated surface of the substrate and the bonding pads in each mounting area electrically connected to the I/O pads of the mating semiconductor chip for each mounting area; and electrically and physically connecting one each of a plurality of heat conductive elements to the third electrode on the second surface of each semiconductor chip and to the associated one of the plurality of heat conductive areas to form a heat path from the semiconductor chip to the associated heat conductive area and an electrical path from the semiconductor chip to an electrical conductor on the heat conductive area.

17. A method of fabricating a multi-chip package as claimed in claim 16 including in addition the step of encapsulating each semiconductor chip of the plurality of semiconductor chips subsequent to performing the electrically and physically connecting step.

18. A method of fabricating a multi-chip package as claimed in claim 17 wherein the step of encapsulating includes encapsulating with a reworkable encapsulant.

19. A method of fabricating a multi-chip package comprising the steps of:

providing a semiconductor substrate of aluminum silicon carbide having a layer of aluminum nitride positioned on a surface thereof so as to form an electrically insulated surface, and providing a plurality of openings through the layer of silicon nitride to the surface of the substrate, each opening defining a heat conductive area;

providing a plurality of semiconductor chips, each chip having an electrical circuit formed thereon and a plurality of electrical I/O pads connected to the electrical circuit and positioned on one surface of the semiconductor chip, each chip further having a second surface provided for attaching a heat sink thereto;

forming a plurality of electrical conductors on the electrically insulated surface so as to define a plurality of semiconductor chip mounting areas with each mounting area having a plurality of bonding pads coupled to the electrical conductors and positioned to mate with the I/O pads of at least one mating semiconductor chip of the plurality of semiconductor chips, each mounting area being further positioned adjacent an associated one of the plurality of heat conductive areas;

mounting one each of the plurality of semiconductor chips on each of the plurality of mounting areas with the one surface of the semiconductor chip adjacent the electrically insulated surface of the substrate and the bonding pads in each mounting area electrically connected to the I/O pads of the mating semiconductor chip for each mounting area; and connecting one each of a plurality of heat conductive elements to the second surface of each semiconductor chip and to the exposed surface of the substrate in the associated one of the plurality of heat conductive areas.

20. A method of fabricating a multi-chip package as claimed in claim 19 including in addition the step of encapsulating each semiconductor chip of the plurality of semiconductor chips subsequent to the step of connecting.

21. A method of fabricating a multi-chip package as claimed in claim 20 wherein the step of encapsulating includes encapsulating with a reworkable encapsulant.

* * * * *